(12) United States Patent
Machida

(10) Patent No.: US 11,507,155 B2
(45) Date of Patent: Nov. 22, 2022

(54) HEAT PIPE WITH SUPPORT POST

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 17/450,876

(22) Filed: Oct. 14, 2021

(65) Prior Publication Data
US 2022/0035427 A1 Feb. 3, 2022

Related U.S. Application Data

(62) Division of application No. 16/244,307, filed on Jan. 10, 2019, now Pat. No. 11,175,707.

(30) Foreign Application Priority Data

Jan. 22, 2018 (JP) .............................. JP2018-008274

(51) Int. Cl.
G06F 1/20 (2006.01)
F28D 15/04 (2006.01)
H01L 23/427 (2006.01)
F28F 3/08 (2006.01)

(52) U.S. Cl.
CPC ............ *G06F 1/203* (2013.01); *F28D 15/043* (2013.01); *F28D 15/046* (2013.01); *F28F 3/086* (2013.01); *H01L 23/427* (2013.01); *H01L 2224/16225* (2013.01)

(58) Field of Classification Search
CPC .. G06F 1/203; G06F 2200/201; G06F 1/1626; F28D 15/043; F28D 15/046; F28D 15/0266; F28F 3/086; F28F 2225/04; H01L 23/427; H01L 2224/16225; H05K 7/20336
USPC .......................... 165/104.22, 104.26; 361/694
See application file for complete search history.

(56) References Cited

U.S. PATENT DOCUMENTS

| 6,330,907 | B1 * | 12/2001 | Ogushi ................. F28D 15/043 165/907 |
| 6,719,040 | B2 | 4/2004 | Sugito et al. |
| 6,863,119 | B2 * | 3/2005 | Sugito ..................... F28F 13/06 165/80.4 |
| 6,901,994 | B1 * | 6/2005 | Jin-Cherng ........... F28D 15/046 165/185 |
| 7,275,588 | B2 | 10/2007 | Hsu |
| 7,422,053 | B2 * | 9/2008 | Siu ........................... F28F 3/02 165/104.33 |
| 8,611,089 | B2 | 12/2013 | Mizuta et al. |
| 8,813,834 | B2 | 8/2014 | Chin |
| 10,082,340 | B2 | 9/2018 | Hsieh |

(Continued)

FOREIGN PATENT DOCUMENTS

| JP | 2002062067 | A | * | 2/2002 | ......... F28D 15/0233 |
| JP | 2007093032 | A | * | 4/2007 | ......... F28D 15/0233 |
| JP | 6146484 | | | 6/2017 | |

*Primary Examiner* — Len Tran
*Assistant Examiner* — Gustavo A Hincapie Serna
(74) *Attorney, Agent, or Firm* — IPUSA, PLLC

(57) ABSTRACT

A heat pipe including a vapor line having a flow path through which a working fluid vapor flows, wherein the vapor line includes walls opposite to each other across the flow path, and a support post disposed in the flow path and spaced apart from the walls, wherein the walls are made of a plurality of metal layers stacked one over another, and the support post is made of a single seamless member having the same thickness as the walls.

5 Claims, 12 Drawing Sheets

(56) References Cited

U.S. PATENT DOCUMENTS

| | | |
|---|---|---|
| 2002/0135979 A1 | 9/2002 | Estes et al. |
| 2003/0159809 A1* | 8/2003 | Valenzuela ......... F28D 15/0233 |
| | | 29/890.032 |
| 2005/0022978 A1 | 2/2005 | Duval |
| 2006/0098411 A1 | 5/2006 | Lee et al. |
| 2007/0056711 A1* | 3/2007 | Ohsawa ................. B23P 15/26 |
| | | 165/104.21 |
| 2008/0078530 A1 | 4/2008 | Chang et al. |
| 2008/0174963 A1* | 7/2008 | Chang ................... H01L 23/373 |
| | | 361/700 |
| 2008/0189948 A1 | 8/2008 | Schulz-Harder |
| 2008/0283223 A1 | 11/2008 | Chang et al. |
| 2009/0025910 A1* | 1/2009 | Hoffman ............... F28D 15/046 |
| | | 165/104.21 |
| 2009/0032226 A1 | 2/2009 | Huang et al. |
| 2009/0040726 A1 | 2/2009 | Hoffman et al. |
| 2009/0159242 A1* | 6/2009 | Zhao ..................... F28D 15/046 |
| | | 165/104.33 |
| 2010/0307721 A1 | 12/2010 | Wang |
| 2010/0326632 A1* | 12/2010 | Nagai ................... H01L 23/427 |
| | | 165/104.21 |
| 2011/0088873 A1 | 4/2011 | Yang |
| 2011/0284188 A1* | 11/2011 | Cai ..................... H01L 21/4882 |
| | | 216/33 |
| 2012/0043060 A1* | 2/2012 | Wang ................... H01L 23/427 |
| | | 165/104.26 |
| 2013/0308272 A1 | 11/2013 | Furuta |
| 2014/0174700 A1 | 6/2014 | Lin et al. |
| 2016/0259383 A1 | 9/2016 | Shioga et al. |
| 2017/0122672 A1 | 5/2017 | Lin |
| 2018/0320985 A1 | 11/2018 | Salim Shirazy et al. |
| 2019/0075682 A1 | 3/2019 | Shioga et al. |

\* cited by examiner

HEAT PIPE WITH SUPPORT POST

CROSS-REFERENCE TO RELATED APPLICATIONS

This application is a divisional of U.S. patent application Ser. No. 16/244,307 filed on Jan. 10, 2019, which is based on and claims priority to Japanese patent application No. 2018-008274 filed on Jan. 22, 2018. The entire contents of these applications are hereby incorporated by reference.

FIELD

The disclosures herein relate to a heat pipe and a method of making a heat pipe.

BACKGROUND

A heat pipe is known as a device for cooling heat generating components such as a CPU (central processing unit) embedded in electronic products. A heat pipe is a device configured to transport heat by utilizing phase changes of a working fluid.

A heat pipe having a flow path constituted by a plurality of stacked metal layers is known in the art, for example. This kind of heat pipe has a pillar made of a plurality of stacked metal layers inside the flow path in order to prevent the flow path from being deformed during a stamping process performed on the metal layers in the manufacturing process.

In the case in which a pillar made of a plurality of stacked metal layers is disposed inside a flow path, a support bar needs to be provided in order to connect the pillar to the pipe wall at a proper point. Provision of such a support bar not only limits freedom in the design of metal layers, but also reduces the amount of space serving as a flow path. The narrowing of a flow path increases pressure loss that is energy loss occurring when a vapor flows inside the flow path. This pressure loss hinders the flow of vapor, thereby significantly lowering the performance of heat transport by the heat pipe.

RELATED-ART DOCUMENTS

Patent Document

[Patent Document 1] Japanese Patent No. 6146484

SUMMARY

According to an aspect of the embodiment, a heat pipe including a vapor line having a flow path through which a working fluid vapor flows, wherein the vapor line includes walls opposite to each other across the flow path, and a support post disposed in the flow path and spaced apart from the walls, wherein the walls are made of a plurality of metal layers stacked one over another, and the support post is made of a single seamless member having the same thickness as the walls.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

The first embodiment is directed to an example in which a loop heat pipe is used.

[Structure of Heat Pipe of First Embodiment]

Figure 1:
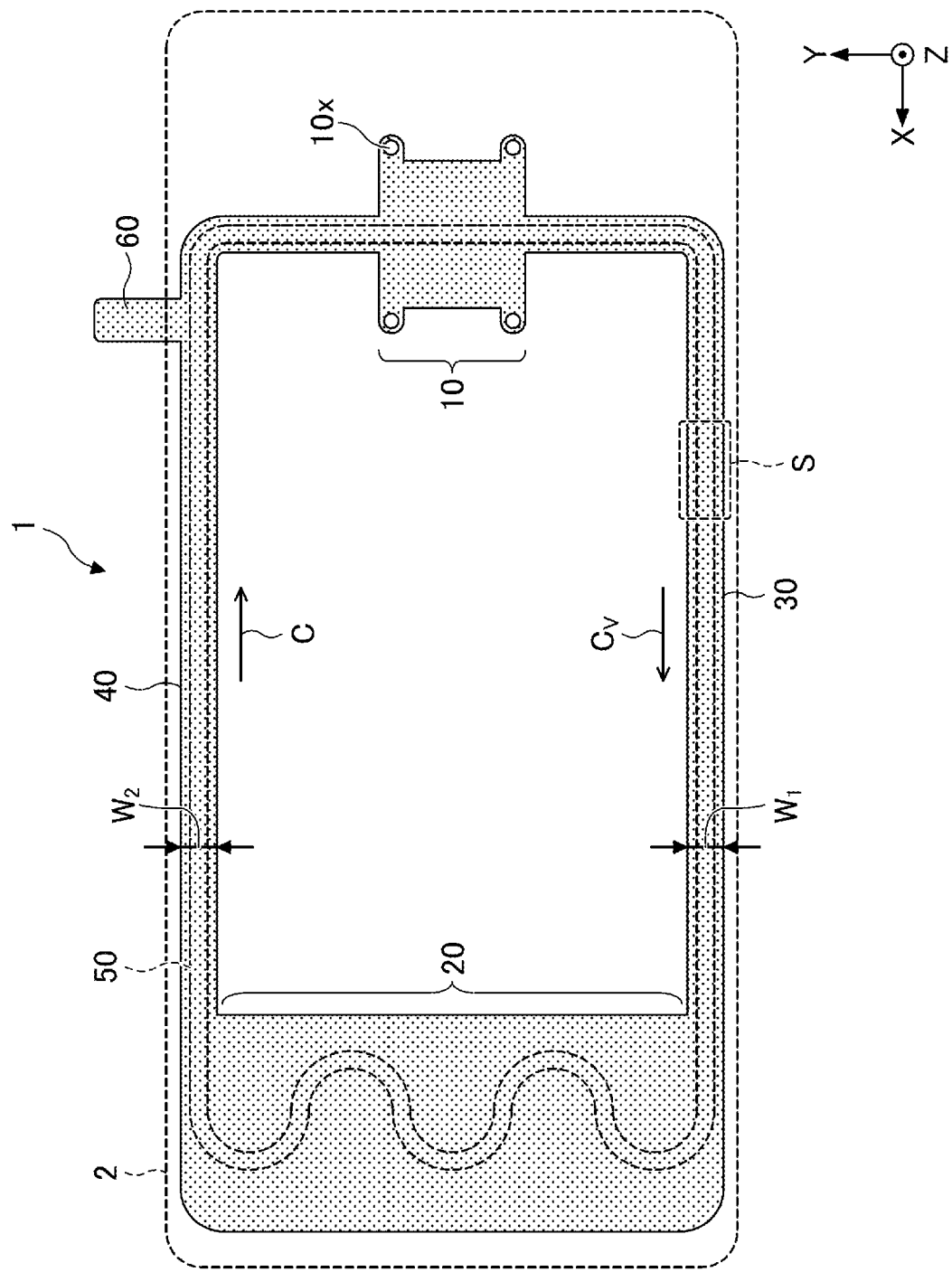
FIG. 1 is a schematic plan view illustrating an example of a loop heat pipe according to a first embodiment.

In the following, a description will be first given of the structure of a loop heat pipe of a first embodiment. FIG. 1 is a schematic plan view illustrating an example of the loop heat pipe according to the first embodiment.

As illustrated in FIG. 1, a loop heat pipe 1 includes an evaporator 10, a condenser 20, a vapor line (i.e., pipe, channel, conduit, or the like) 30, a liquid line (i.e., pipe, channel, conduit, or the like) 40, and an inlet 60. The loop heat pipe 1 may be embedded in a mobile electronic apparatus 2 such as a smartphone, a tablet computer, or the like.

The evaporator 10 of the loop heat pipe 1 has the function to evaporate a working fluid C to generate a vapor Cv. The condenser 20 has the function to cause the vapor Cv of the working fluid C to condense into a liquid. The evaporator 10 and the condenser 20 are connected through the vapor line 30 and the liquid line 40, which forms a loop flow path 50 through which the vapor Cv or the working fluid C flow through the vapor line 30 or the liquid line 40.

The inlet 60, which is used to inject the working fluid C into the liquid line 40, is hermetically sealed after the working fluid is injected. Although the inlet 60 is connected to the liquid line 40 in the present embodiment, the inlet 60 may alternatively be connected to the condenser 20 or to the vapor line 30. In such a case, the working fluid C injected into the condenser 20 or the vapor line 30 flows through the flow path 50 to reach the liquid line 40.

Figure 2:
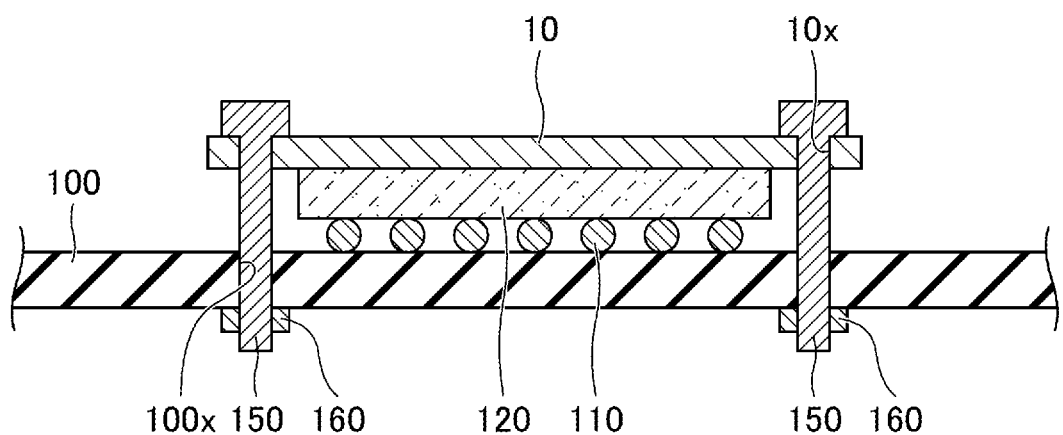
FIG. 2 is a cross-sectional view of an evaporator and surrounding structure of the loop heat pipe according to the first embodiment.

FIG. 2 is a cross-sectional view of the evaporator and surrounding structure of the loop heat pipe according to the first embodiment. As illustrated in FIG. 1 and FIG. 2, the evaporator 10 may have four penetrating holes 10x. Bolts 150 inserted through the penetrating holes 10x of the evaporator 10 and the penetrating holes 100x of a circuit board 100 are secured with nuts 160 at the lower face of the circuit board 100, thereby fastening the evaporator 10 to the circuit board 100.

A heat generating component 120 such as a CPU is mounted on the circuit board 100 with bumps 110. The upper face of the heat generating component 120 is in close contact with the lower face of the evaporator 10. The working fluid C in the evaporator 10 evaporates into the vapor Cv due to heat generated by the heat generating component 120.

As illustrated in FIG. 1, the vapor Cv generated by the evaporator 10 passes through the vapor line 30 to reach the condenser 20, and condenses back into a liquid in the condenser 20. With this arrangement, the heat generated by the heat generating component 120 moves to the condenser 20, which reduces the temperature increase of the heat generating component 120. The liquid working fluid C generated by the condenser 20 passes through the liquid line 40 to reach the evaporator 10. A width $W_1$ of the vapor line 30 may approximately be 8 millimeters, for example. A width $W_2$ of the liquid line 40 may approximately be 6 millimeters, for example.

The working fluid C is not limited to a particular kind. It is preferable to use a fluid having a high vapor pressure and a high latent heat of vaporization for the purpose of efficiently cooling the heat generating component 120 with the latent heat of vaporization. Examples of such fluid include ammonia, water, chlorofluorocarbon, alcohol, and acetone.

The evaporator 10, the condenser 20, the vapor line 30, the liquid line 40, and the inlet 60 may be formed as a plurality of staked metal layers, for example. The metal layers, which may be copper layers having superior thermal conductivity, are directly joined through solid-state bonding or the like. The thickness of each of the metal layers may approximately be 50 micrometers to 200 micrometers, for example.

The metal layers are not limited to copper layers, and may alternatively be stainless layers, aluminum layers, magnesium-alloy layers, or the like. The number of stacked metal layers is not limited to a particular number.

Figure 3A:
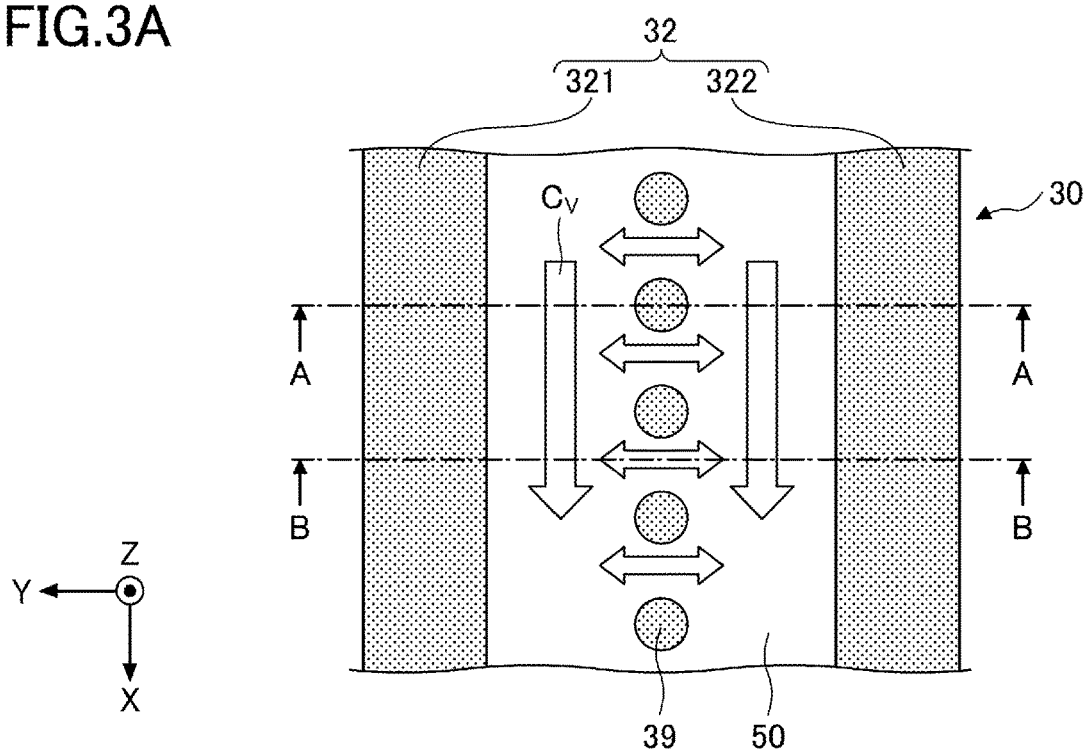
FIGS. 3A through 3C are drawings illustrating an example of the structure of a vapor line in the loop heat pipe according to the first embodiment.
Figure 3B:
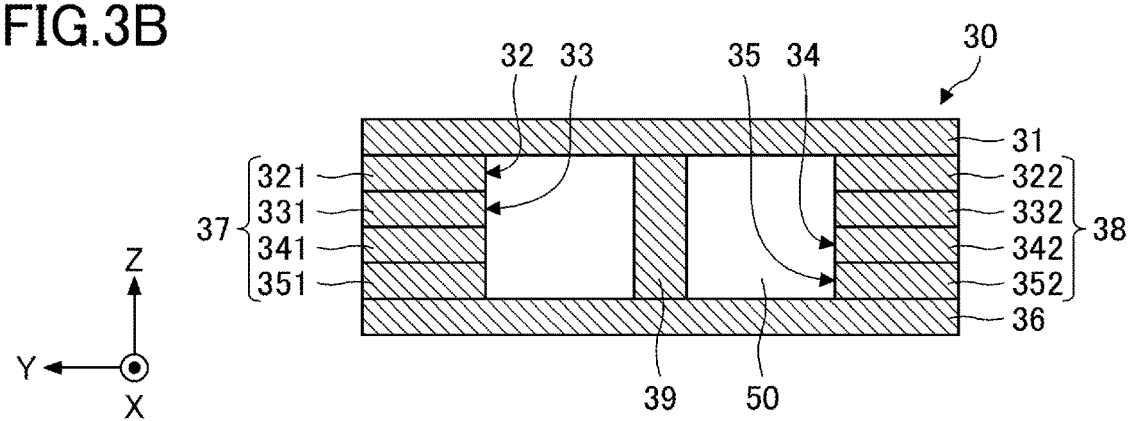
Figure 3C:
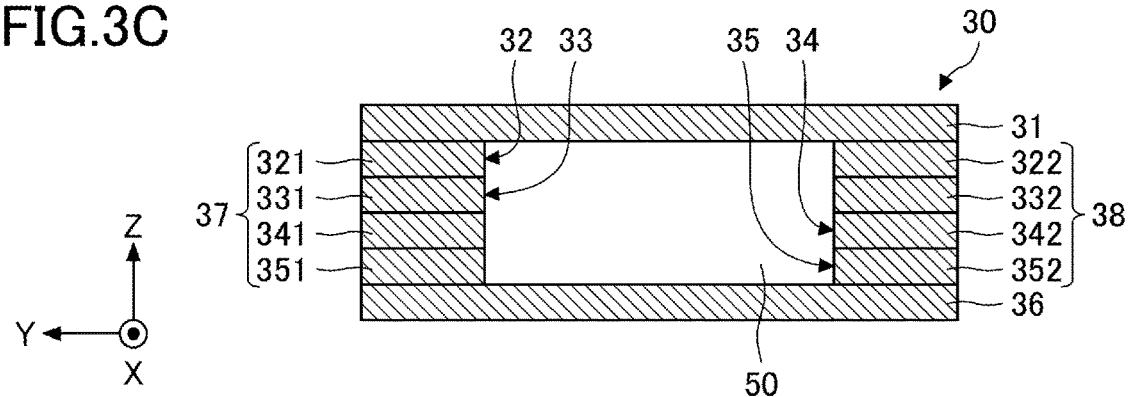

FIGS. 3A through 3C are drawings illustrating an example of the structure of a vapor line in the loop heat pipe according to the first embodiment. FIG. 3A is a partial plan view of a section S illustrated in FIG. 1. FIG. 3B is a cross-sectional view taken along a line A-A illustrated in FIG. 3A. FIG. 3C is a cross-sectional view taken along a line B-B illustrated in FIG. 3A. In FIG. 3A, the outermost metal layer 31 is omitted from illustration. In FIG. 3A, the flow of the vapor Cv is schematically illustrated by arrows.

As illustrated in FIGS. 3A through 3C, the structure of the vapor line 30 may be such that six layers comprised of an outermost metal layer 36, an intermediate metal layer 35, an intermediate metal layer 34, an intermediate metal layer 33, an intermediate metal layer 32, and an outermost metal layer 31 are stacked one over another. When there is no need to discriminate an outermost metal layer from an intermediate metal layer, the term "metal layer" may be used as a collective term to represent both.

The outermost metal layers 31 and 36 are situated at the respective outermost positions in the thickness direction of the stacked metal layers constituting the vapor line 30. The intermediate metal layers 32 through 35 are stacked one over another between the outermost metal layer 31 and the outermost metal layer 36. In the present embodiment, each of the outermost metal layers 31 and 36 is a flat solid structure without holes or grooves, and constitutes part of the outer wall of the vapor line 30, The number of staked metal layers is not limited to six. It suffices to have at least four or more stacked metal layers. Namely, it suffices for the two outermost metal layers to have two or more intermediate metal layers disposed therebetween.

The intermediate metal layer 32 has wall portions 321 and 322 which are spaced apart and opposite each other in the Y direction. The intermediate metal layer 33 has wall portions 331 and 332 which are spaced apart and opposite each other in the Y direction. The intermediate metal layer 34 has wall portions 341 and 342 which are spaced apart and opposite each other in the Y direction. The intermediate metal layer 35 has wall portions 351 and 352 which are spaced apart and opposite each other in the Y direction.

The stacked structure comprised of the wall portions 351, 341, 331, and 321 constitutes one wall 37 (i.e., sidewall) of the vapor line 30. Further, the stacked structure comprised of the wall portions 352, 342, 332, and 322 constitutes the other wall 38 (i.e., sidewall) of the vapor line 30. The outermost metal layers 31 and 36 are laminated to the upper and lower ends of the stacked metal layers, respectively, such as to have the walls 37 and 38 placed therebetween. The walls 37 and 38 opposite to each other across a gap in the Y direction and the outermost metal layers 31 and 36 opposite to each other across a gap in the Z direction defines the flow path 50.

The outermost metal layers 31 and 36 and the intermediate metal layers 32 through 35 may be copper layers having superior thermal conductivity, for example, and are directly joined through solid-phase bonding or the like. The thickness of each of the outermost metal layers 31 and 36 and the intermediate metal layers 32 through 35 may approximately be 50 micrometers to 200 micrometers, for example. The outermost metal layers 31 and 36 and the intermediate metal layers 32 through 35 are not limited to copper layers, and may alternatively be stainless layers, aluminum layers, magnesium-alloy layers, or the like.

Support posts 39 having the same thickness (i.e., the same height) as the walls 37 and 38 are disposed in the flow path 50 at a position spaced from the walls 37 and 38. The support posts 39 have an upper face thereof bonded to the lower face of the outermost metal layer 31 and a lower face thereof bonded to the upper face of the outermost metal layer 36. Each of the support posts 39 does not have a multilayer structure made of metal layers, but is made of a single seamless member. The support posts 39 may be made of copper, stainless, aluminum, a magnesium-alloy, or the like.

The support posts 39 may be a cylindrical shape with a diameter of approximately 100 micrometers, for example. Alternatively, the support posts 39 may be a pillar having another cross-sectional shape different from a circle, such as a prism. The support posts 39 may be disposed at spaced intervals (i.e., spaced apart at a predetermined distance) along a straight line parallel to the X axis extending approximately at the center between the wall 37 and the wall 38, for example. In other words, a space (i.e., flow path allowing the passage of the vapor Cv) is provided between the adjacent support posts 39. The support posts 39 are separate from the outermost metal layers 31 and 36 and the intermediate metal layers 32 through 35, which allows the support posts 39 to be disposed at any desired positions inside the flow path 50 according to required specifications.

The support posts 39 are disposed for the purpose of preventing the flow path made of the stacked metal layers from collapsing when the metal layers are staked and pressed (by a stamping process) during the process of making the vapor line 30 (i.e., the process step illustrated in FIG. 4D, which will be described later).

[Method of Making Loop Heat Pipe of First Embodiment]

In the following, a method of making the loop heat pipe of the first embodiment will be described with main reference to the process step of disposing the support posts. FIGS. 4A through 4D are drawings illustrating an example of the process of making the loop heat pipe according to the first embodiment. FIGS. 4A through 4D illustrate the same cross-section as the one illustrated in FIG. 3B.

In the following description of the manufacturing method, the walls and the support posts are referred to as wall parts 37a and 38a and support post parts 39, respectively, before the solid-state bonding is performed. After the solid-state bonding is performed, these are referred to as the walls 37 and 38 and the support posts 39.

Figure 4A:
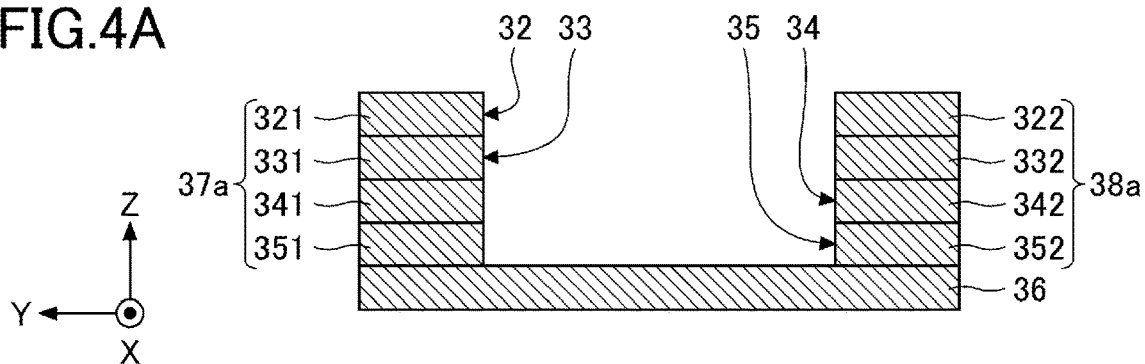
FIGS. 4A through 4D are drawings illustrating an example of process steps for making the loop heat pipe according to the first embodiment.

In the process step illustrated in FIG. 4A, the outermost metal layer 36 having a flat, solid shape without any holes or grooves is prepared. The intermediate metal layer 32 having the wall portions 321 and 322 which are spaced apart and opposite to each other in the Y direction is also prepared. The intermediate metal layer 33 having the wall portions 331 and 332 which are spaced apart and opposite to each other in the Y direction is also prepared. The intermediate metal layer 34 having the wall portions 341 and 342 which are spaced apart and opposite to each other in the Y direction is also prepared. The intermediate metal layer 35 having the wall portions 351 and 352 which are spaced apart and opposite to each other in the Y direction is also prepared. The material and thickness of the intermediate metal layers 32 through 35 and the outermost metal layer 36 are the same as those previously described. The intermediate metal layers 32 through 35 are made by performing an etching process or a stamping process with respect to flat, solid metal layers. The intermediate metal layer 35, the intermediate metal layer 34, the intermediate metal layer 33, and the intermediate metal layer 32 are successively stacked on the outermost metal layer 36. In this process step, the metal layers are simply in contact with each other, and are not securely bonded.

Figure 4B:
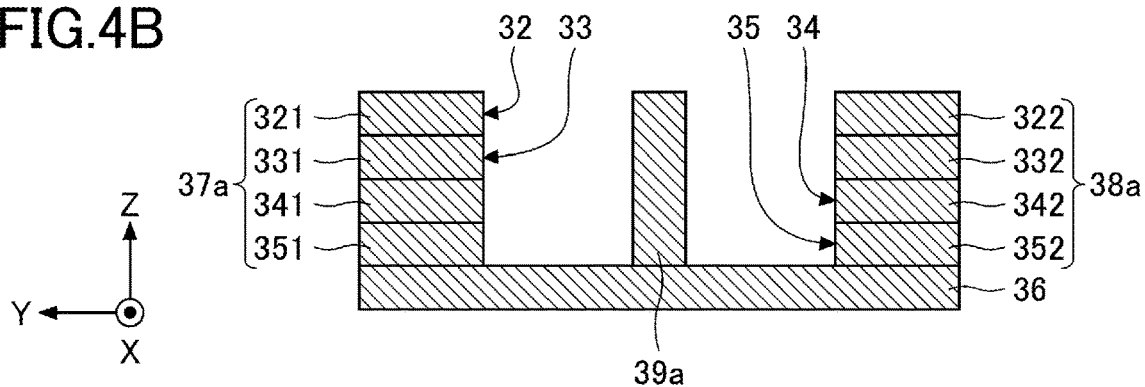

In the process step illustrated in FIG. 4B, the support post part 39a is disposed at predetermined positions on the outermost metal layer 36. The support post part 39a will become one of the support posts 39 after the solid-state bonding, which will be described later. The support post part 39a may be disposed by use of a mounding machine (i.e., mounter) used for mounting electronic components, for example. In this process step, the upper face of the outermost metal layer 36 and the lower face of the support post part 39a are simply in contact with each other, without being securely bonded. According to need, the lower face of the support post part 39a may be tentatively secured to the outermost metal layer 36 with a solder, an adhesive which evaporates upon heating, or the like. The thickness of the support post part 39a may be the same as the thickness of wall parts 37a and 38a before the solid-state bonding, for example. The wall parts 37a and 38a will become the walls 37 and 38 after the solid-state bonding, which will be described later. The thickness of the support post part 39a is not limited to this example, and may alternatively be thicker than the thickness of the wall parts 37a and 38a before the solid-state bonding, for example.

Figure 4C:
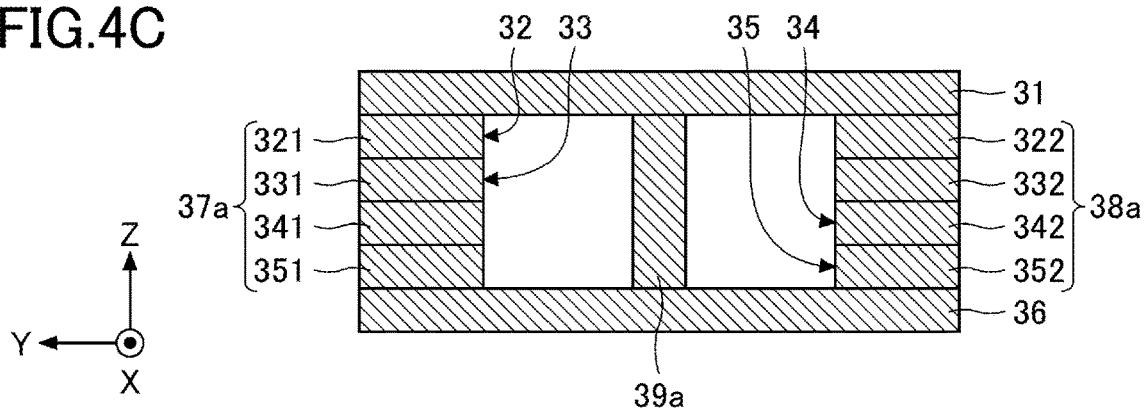

In the process step illustrated in FIG. 4C, the outermost metal layer 31 having a flat, solid shape without any holes or grooves is disposed on the intermediate metal layer 32. In this process step, the outermost metal layer 31, the intermediate metal layer 32, and the support post part 39a are simply in contact with each other, without being securely bonded.

Figure 4D:
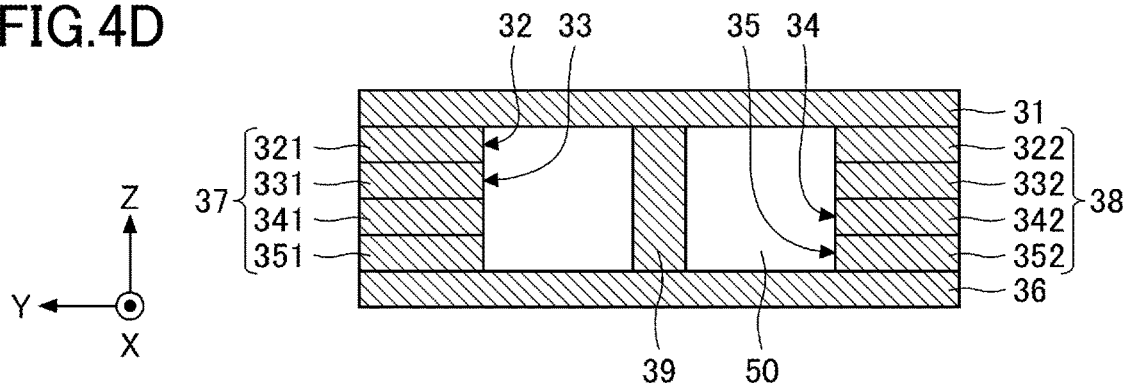

In the process step illustrated in FIG. 4D, the parts of the structure illustrated in FIG. 4C are joined through solid-state bonding by applying pressure and heat. As a result, the metal layers adjacent each other are directly bonded, so that the loop heat pipe 1 having the evaporator 10, the condenser 20, the vapor line 30, the liquid line 40, and the inlet 60 is completed in final form. The vapor line 30 and the liquid line 40 constitute the flow path 50. The support post part 39a has an upper face thereof securely bonded to the lower face of the outermost metal layer 31 and a lower face thereof securely bonded to the upper face of the outermost metal layer 36, thereby becoming the support post 39 situated in the flow path 50 of the vapor line 30. Since each metal layer and the support post part 39a is compressed by the application of pressure, the entirety of the structure illustrated in FIG. 4D becomes thinner than the entirety of the structure illustrated in FIG. 4C.

Solid-state bonding is a method that heats and softens objects while maintained in the solid state (i.e., solid phase) without melting, and applies pressure to cause plastic deformation to achieve bonding. It is preferable for all the outermost metal layers 31 and 36, the intermediate metal layers 32 through 35, and the support post parts 39a to be made of the same material in order to achieve satisfactory bonding between the adjacent metal layers and between the metal layers and the support port parts through solid-state bonding.

Subsequently, the liquid line 40 is exhausted by use of a vacuum pump or the like, followed by injecting the working fluid C into the liquid line 40 through the inlet 60. The end of the inlet 60 is then crushed into a flattened shape to provide hermetic sealing that prevents the working fluid C injected into the liquid line 40 from escaping to the outside.

Figure 5:
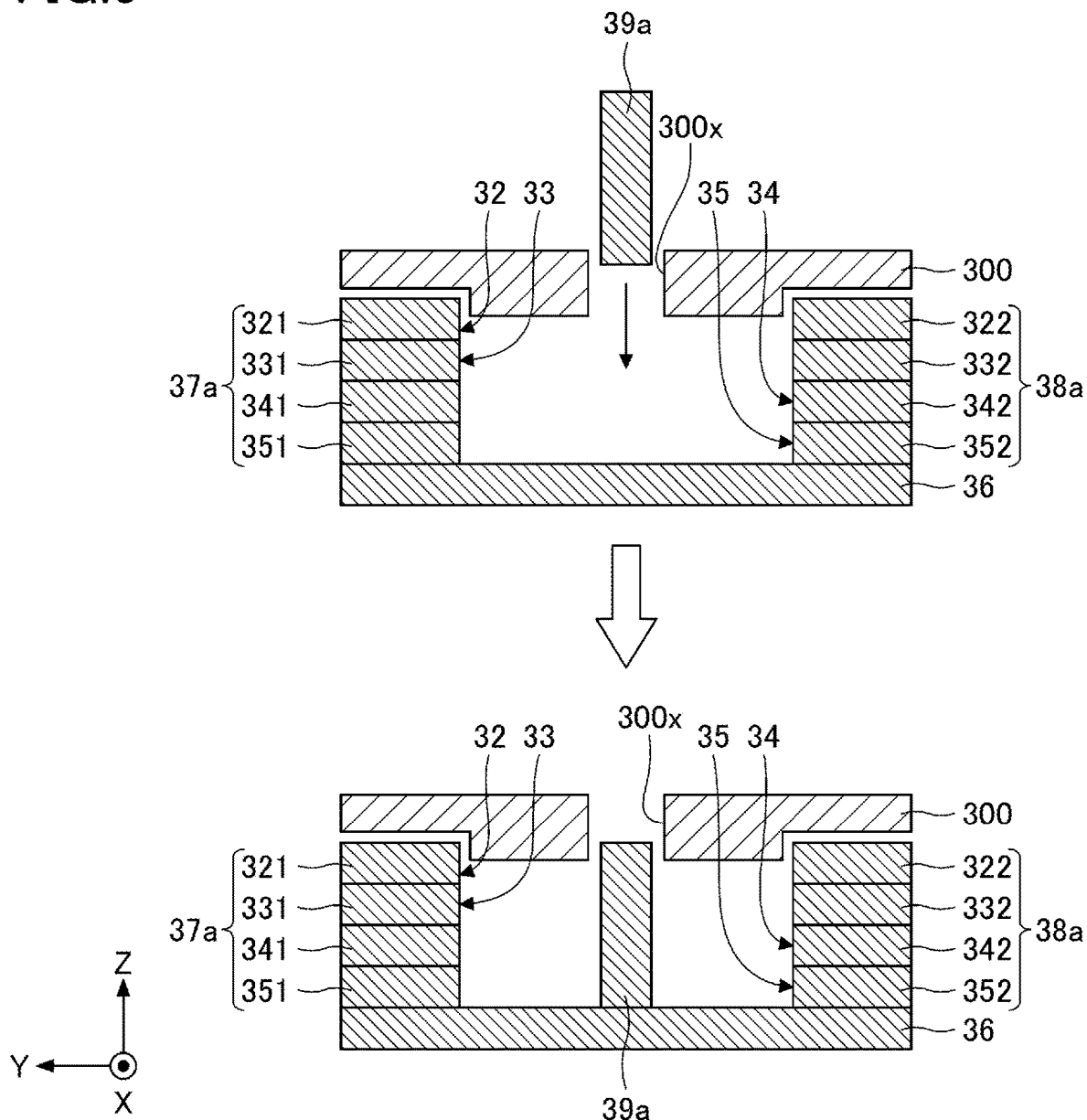
FIG. 5 is a drawing illustrating an example of process steps for making the loop heat pipe according to the first embodiment.

It may be noted that the process step illustrated in FIG. 4B may be replaced with the process step illustrated in FIG. 5. As illustrated in the upper portion of FIG. 5 above the thick arrow, a mask 300 made of a metal or the like is placed on the structure illustrated in FIG. 4A. The mask 300 has an opening 300x for placing the support post part 39a, at the position at which the support post part 39a is to be preferably placed. In the case of the cylindrical support post parts 39a being disposed at spaced intervals, for example, the mask 300 has circular openings 300x formed at spaced intervals having a diameter slightly greater than that of the support post parts 39a. The support post parts 39a are then inserted through the respective openings 300x, thereby being placed at predetermined positions on the outermost metal layer 36 as illustrated in the portion of FIG. 5 below the thick arrow. The mask 300 is then removed. Process steps subsequent thereto are the same as those illustrated in FIG. 4C and FIG. 4D.

In the following, the advantages of providing the support posts 39 in the vapor line 30 will be described by referring to a comparative example.

Figure 6A:
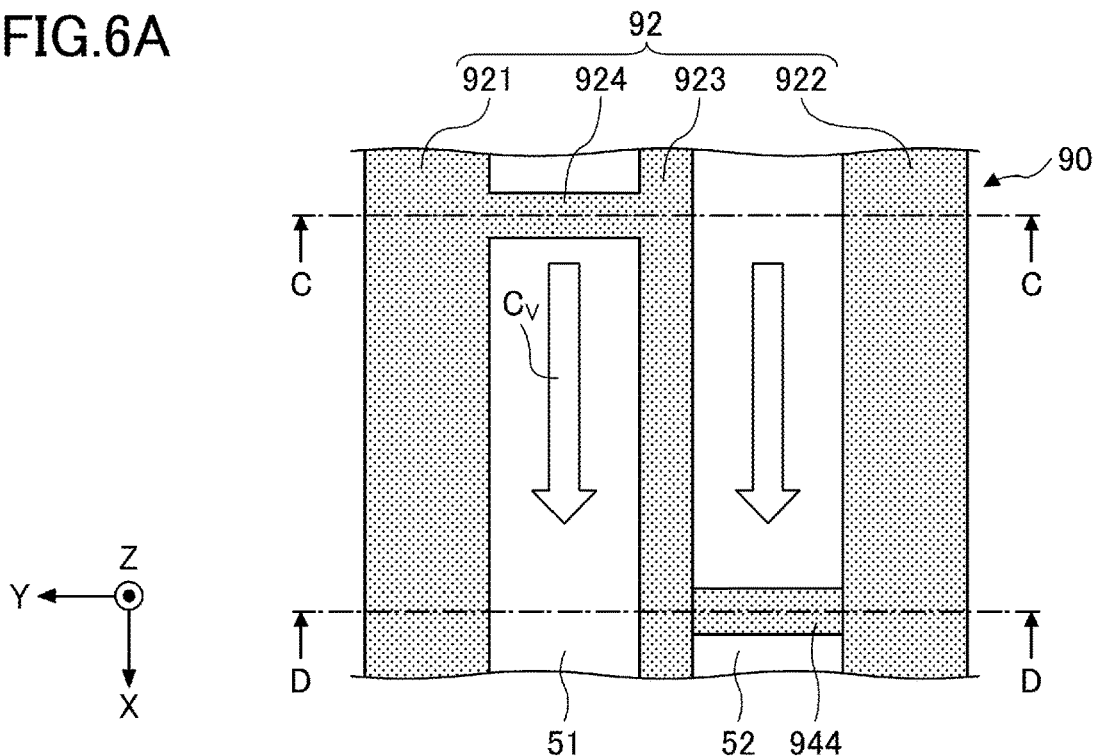
FIGS. 6A through 6C are drawings illustrating an example of the structure of a vapor line in a loop heat pipe according to a comparative example.
Figure 6B:
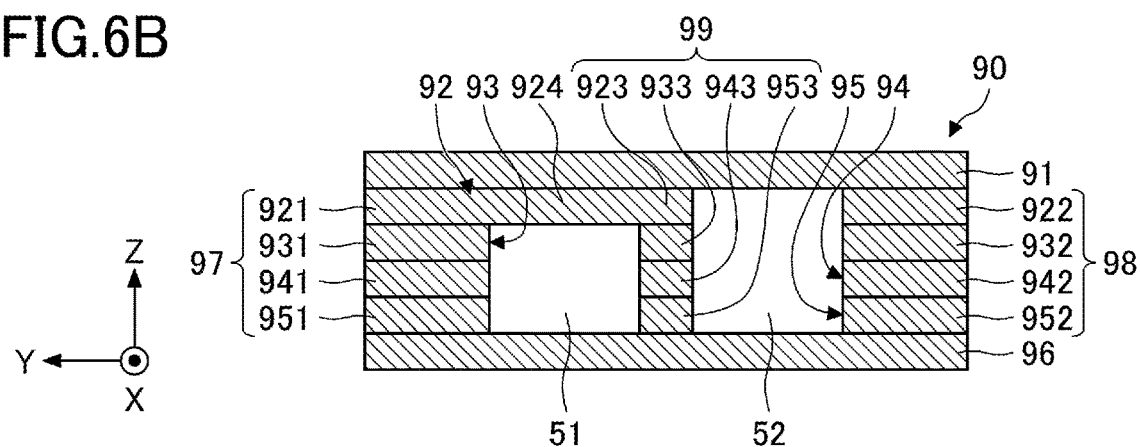
Figure 6C:
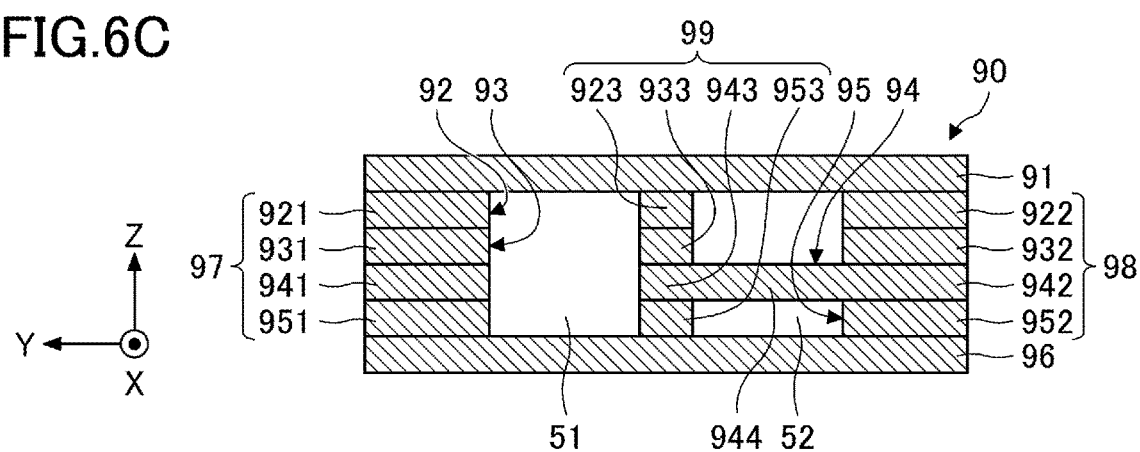

FIGS. 6A through 6C are drawings illustrating an example of the structure of a vapor line in a loop heat pipe according to a comparative example. FIG. 6A illustrates a partial plan view of a vapor line of the comparative example. FIG. 6B is a cross-sectional view taken along a line C-C illustrated in FIG. 3A. FIG. 6C is a cross-sectional view taken along a line D-D illustrated in FIG. 6A. In FIG. 6A, the outermost metal layer 91 is omitted from illustration. In FIG. 6A, the flow of the vapor Cv is schematically illustrated by arrows.

As illustrated in FIGS. 6A through 6C, the structure of the vapor line 90 may be such that six layers comprised of an outermost metal layer 96, an intermediate metal layer 95, an intermediate metal layer 94, an intermediate metal layer 93, an intermediate metal layer 92, and an outermost metal layer 91 are stacked one over another.

The outermost metal layers 91 and 96 are situated at the respective outermost positions in the thickness direction of the stacked metal layers constituting the vapor line 90. The intermediate metal layers 92 through 95 are stacked one over another between the outermost metal layer 91 and the outermost metal layer 96. Each of the outermost metal layers 91 and 96 is a flat solid structure without holes or grooves, and constitutes part of the outer wall of the vapor line 90.

The intermediate metal layer 92 has wall portions 921 and 922 which are spaced apart and opposite to each other in the Y direction, and also has a support structure part 923 and a support bar 924. The intermediate metal layer 93 has wall portions 931 and 932 which are spaced apart and opposite to each other in the Y direction, and also has a support structure part 933 and a support bar (not shown). The intermediate metal layer 94 has wall portions 941 and 942 which are spaced apart and opposite to each other in the Y direction, and also has a support structure part 943 and a support bar 944. The intermediate metal layer 95 has wall portions 951 and 952 which are spaced apart and opposite to each other in the Y direction, and also has a support structure part 953 and a support bar (not shown). Support bars, which are members for positioning and holding the support structure part relative to the walls, are provided in appropriate numbers at appropriate positions with respect to each intermediate metal layer.

The stacked structure comprised of the wall portions 951, 941, 931, and 921 constitutes one wall 97 (i.e., sidewall) of the vapor line 90. Further, the stacked structure comprised of the wall portions 952, 942, 932, and 922 constitutes the other wall 98 (i.e., sidewall) of the vapor line 90. The stacked structure comprised of the support structure parts 953, 943, 933, and 923 constitutes a support structure 99 serving as a partition wall between the wall 97 and wall 98 of the vapor line 90.

The wall 97 and the support structure 99 opposite to each other across a gap in the Y direction and the outermost metal layers 91 and 96 opposite to each other across a gap in the Z direction defines a flow path 51. The wall 98 and the support structure 99 opposite to each other across a gap in the Y direction and the outermost metal layers 91 and 96 opposite to each other across a gap in the Z direction defines a flow path 52. The flow path 51 and the flow path 52 are completely separated from each other by the support structure 99, so that the vapor Cv inside the flow path 51 and the vapor Cv inside the flow path 52 flow independently of each other. Namely, the vapor Cv does not transit from the flow path 51 to the flow path 52 and vice versa.

As described above, the vapor line 90 of the comparative example is such that the support structure 99 is comprised of stacked metal layers similarly to the walls 97 and 98. Because of this, the support structure parts are not easily placed on the outermost metal layer when manufacturing the vapor line 90. As illustrated in FIGS. 6A through 6C, further, each intermediate metal layer needs to have support bars for positioning and holding the support structure part relative to the wall parts.

Provision of such support bars not only limits freedom in the design of intermediate metal layers, but also reduces the amount of space serving as a flow path. The narrowing of a flow path increases pressure loss that is energy loss occurring when the vapor Cv flows inside the flow path. This pressure loss hinders the flow of the vapor Cv, thereby significantly lowering the performance of heat transport by the loop heat pipe.

In the present embodiment, the support posts 39, each of which is not a structure comprised of stacked metal layers but made of a single seamless member, are provided. This allows the support posts 39 to be easily placed on the outermost metal layer 36 as illustrated in FIG. 4B and in FIG. 5 when manufacturing the vapor line 30. There is thus no need to provide a support bar for each intermediate metal layer.

Consequently, the support posts 39 may be designed independently of the designing of intermediate metal layers. Namely, the support posts 39 may be designed to have a desired shape independent of intermediate metal layers, and their placement positions may also be freely chosen. This improves freedom in the placement of the support posts 39 and also allows the placement positions to be readily modified. Moreover, the flow path 50 having no support bars and thus having a wider space is less likely to cause pressure loss in the flow path 50, so that the flow of the vapor Cv is not hindered, resulting in the performance of heat transport by the loop heat pipe 1 being less likely to be degraded. Such advantages are also provided when using a single continuous support post (i.e., partition-like structure) in place of the separate support posts 39 provided at spaced intervals.

The use of the separate support posts 39 placed at spaced intervals further provides the following advantages. In the case of the vapor line 90, provision of the single continuous support structure 99 in the vapor line 90 divides the flow path into the two flow paths 51 and 52, and causes each of the flow paths to be narrowed by the support bars. As a result, pressure loss in each flow path significantly increases so as to hinder the flow of the vapor Cv, thereby creating a risk of causing the loop heat pipe to fail to operate properly.

In contrast, provision of the separate support posts 39 in the vapor line 30 does not divide the flow path 50 into two, and does not cause the narrowing of the flow path since there are no support bars. In the flow path 50, therefore, the vapor Cv may freely go across the support posts 39 from the side where the wall 37 is situated to the side where the wall 38 is situated, and vice versa. With this arrangement, pressure loss in the flow path 50 is significantly reduced, and, thus, the flow of the vapor Cv is not hindered, which makes it significantly less likely for the performance of heat transport by the loop heat pipe 1 to be degraded.

<First Variation of First Embodiment>

The first variation of the first embodiment is directed to an example in which one of the outermost metal layers has recesses at the positions where the support posts are to be disposed. In connection with the first variation of the first embodiment, a description of the same or similar constituent elements as those of the previously provided descriptions may be omitted as appropriate.

Figure 7A:
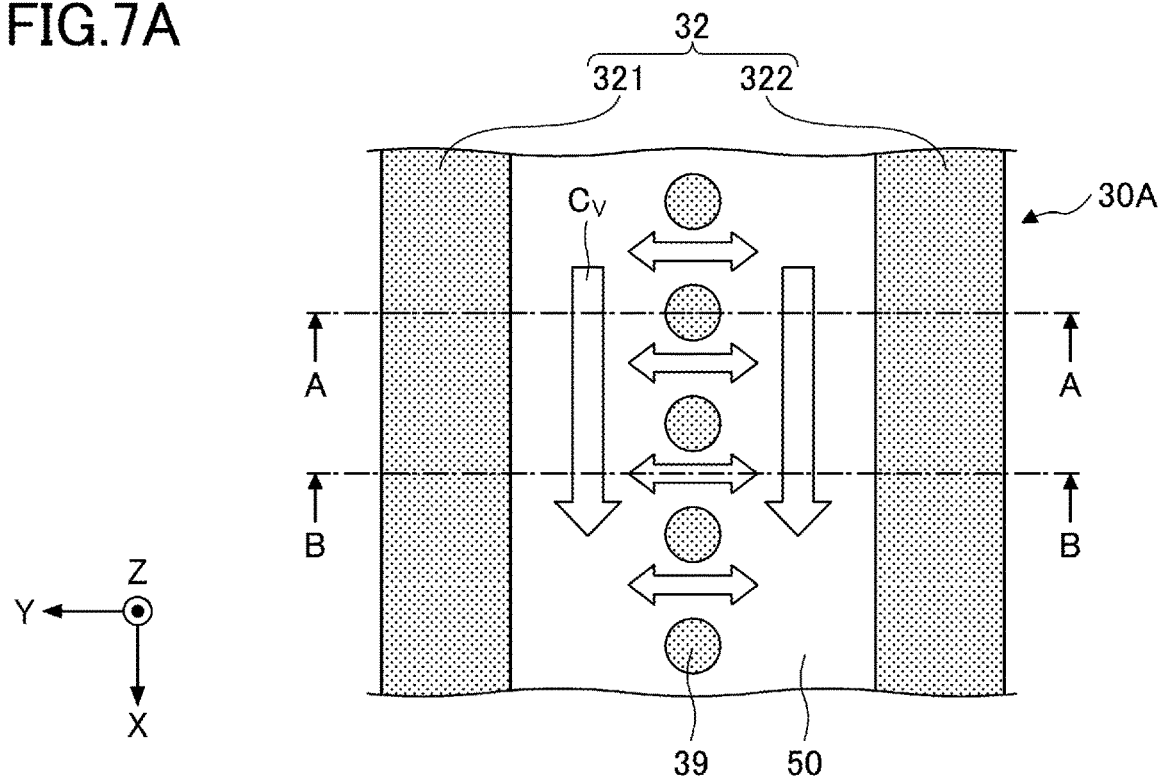
FIGS. 7A through 7C are drawings illustrating an example of the structure of a vapor line in a loop heat pipe according to a first variation of the first embodiment.
Figure 7B:
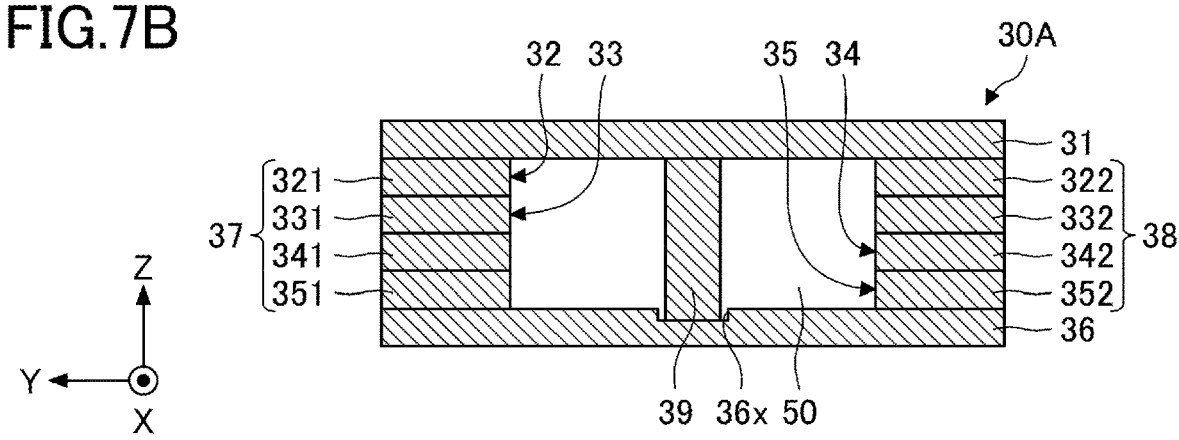
Figure 7C:
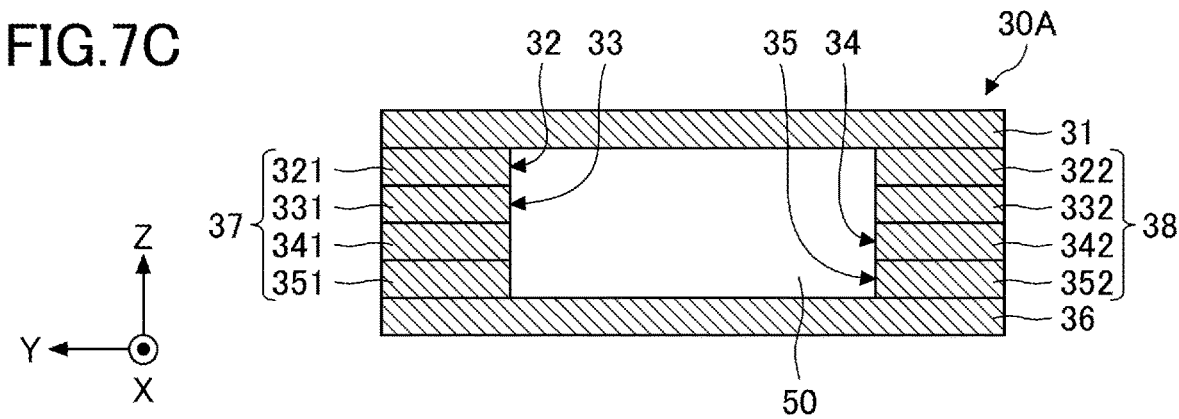

FIGS. 7A through 7C are drawings illustrating an example of the structure of a vapor line in a loop heat pipe according to the first variation of the first embodiment. FIG. 7A is a partial plan view corresponding to FIG. 3A. FIG. 7B is a cross-sectional view taken along a line A-A illustrated in FIG. 7A. FIG. 7C is a cross-sectional view taken along a line B-B illustrated in FIG. 7A. In FIG. 7A, the outermost metal layer 31 is omitted from illustration. In FIG. 7A, the flow of the vapor Cv is schematically illustrated by arrows.

By referring to FIGS. 7A through 7C, a vapor line 30A differs from the vapor line 30 (see FIGS. 3A through 3C, for example) in that the outermost metal layer 36 has a recess 36x on the upper surface thereof having a shape into which one end of the support post 39 can be inserted, and the lower end face of the support post 39 is bonded to the bottom face of the recess 36x.

The thickness (i.e., height) of the support post 39 exposed inside the flow path 50 (i.e., inside the space excluding the recess 36x) is the same as the thickness of the walls 37 and 38. In other words, the total thickness of the support post 39 is equal to the sum of the thickness of the walls 37 and 38 and the depth of the recess 36x.

Provision of the recess 36x in the upper face of the outermost metal layer 36 makes it easier to align the support post part 39a on the outermost metal layer 36 during the process step illustrated in FIG. 4B.

The recess 36x may be formed by performing half-etching on the upper surface of the outermost metal layer 36, for example. According to need, the lower face of the support post part 39a may be tentatively secured to the bottom face of the recess 36x with a solder, an adhesive which evaporates upon heating, or the like.

The thickness of the support post part 39a may be the same as the thickness of wall parts 37a and 38a before the solid-state bonding, for example.

Even when the thickness of the wall parts 37a and 38a and the thickness of the support post part 39a are set equal to each other before the solid-state bonding, pressure applied at the time of sold-state bonding serves to compress the metal layers and the support posts, resulting in a thickness variation equal to the depth of the recess 36x being absorbed. The thickness of the support post part 39a is not limited to this example, and may alternatively be thicker than the thickness of the wall parts 37a and 38a before the solid-state bonding, for example.

<Second Variation of First Embodiment>

The second variation of the first embodiment is directed to an example in which both of the outermost metal layers have recesses for aligning the support posts. In connection with the second variation of the first embodiment, a description of the same or similar constituent elements as those of the previously provided descriptions may be omitted as appropriate.

Figure 8A:
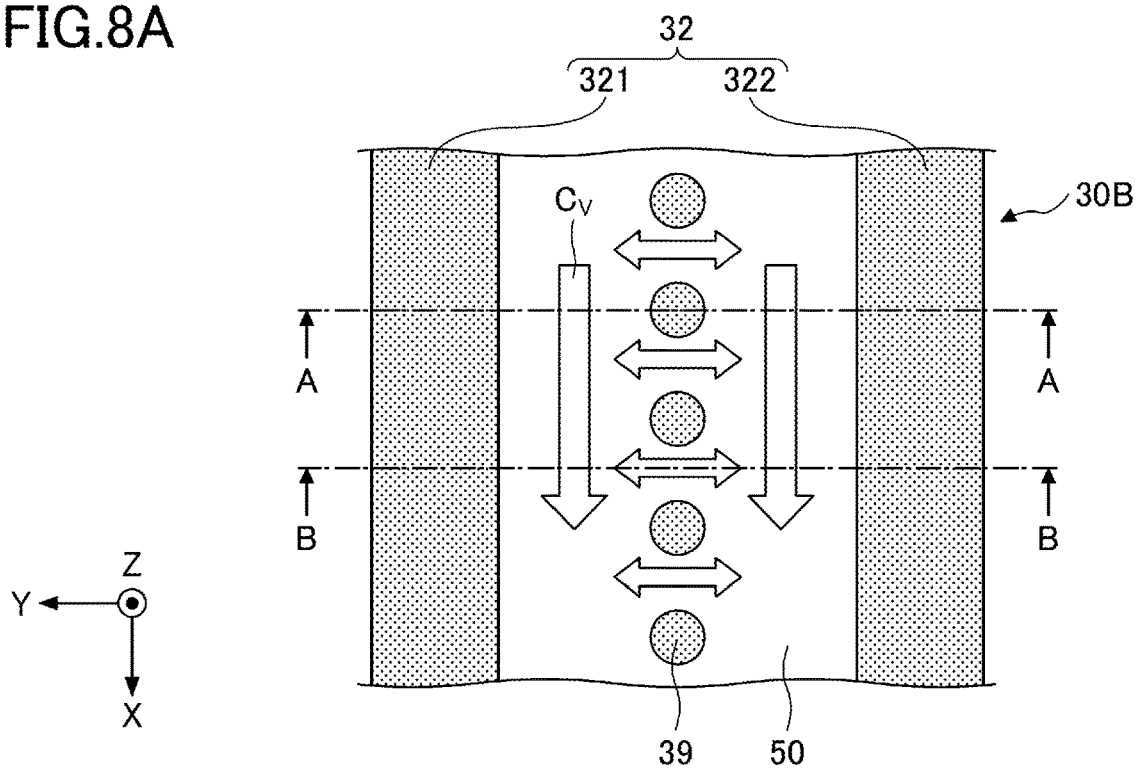
FIGS. 8A through 8C are drawings illustrating an example of the structure of a vapor line in a loop heat pipe according to a second variation of the first embodiment.
Figure 8B:
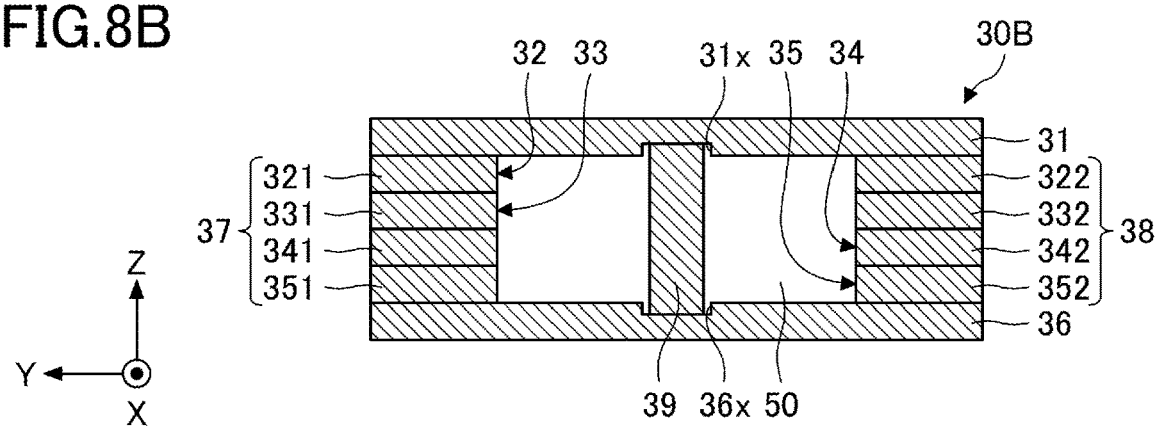
Figure 8C:
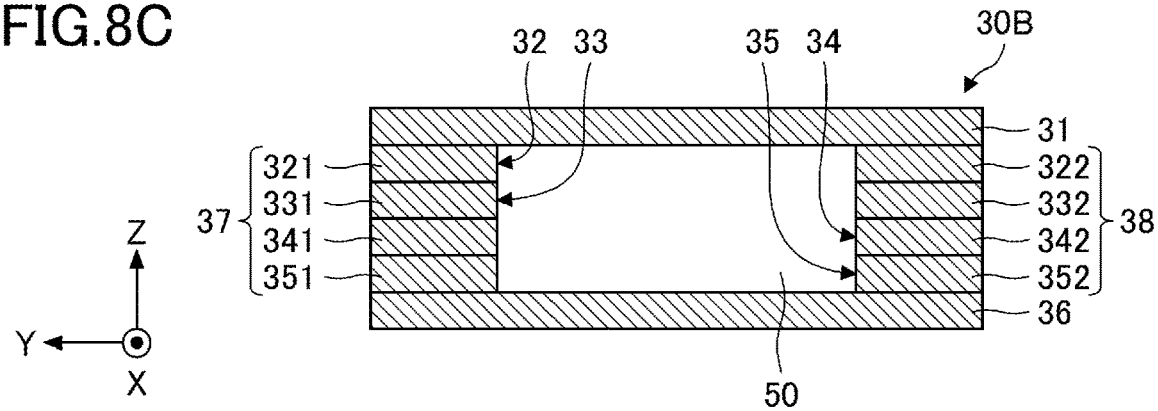

FIGS. 8A through 8C are drawings illustrating an example of the structure of a vapor line in a loop heat pipe according to the second variation of the first embodiment. FIG. 8A is a partial plan view corresponding to FIG. 3A. FIG. 8B is a cross-sectional view taken along a line A-A illustrated in FIG. 8A. FIG. 8C is a cross-sectional view taken along a line B-B illustrated in FIG. 8A. In FIG. 8A, the outermost metal layer 31 is omitted from illustration. In FIG. 8A, the flow of the vapor Cv is schematically illustrated by arrows.

In a vapor line 30B illustrated in FIG. 8B, a recess 31x having a shape into which one end of the support post 39 can be inserted is formed at the lower face of the outermost metal layer 31, and, also, a recess 36x having a shape into which the other end of the support post 39 can be inserted is formed at the upper face of the outermost metal layer 36 at the same position as the recess 31x in the plan view. The upper end face of the support post 39 is bonded to the back face of the recess 31x, and the lower face of the support post 39 is bonded to the bottom face of the recess 36x. These are the differences from the vapor line 30 (see FIGS. 3A through 3C, for example).

The thickness (i.e., height) of the support post 39 exposed inside the flow path 50 (i.e., inside the space excluding the recesses 31x and 36x) is the same as the thickness of the walls 37 and 38. In other words, the total thickness of the support post 39 is equal to the sum of the thickness of the walls 37 and 38 and the depths of the recesses 31x and 36x.

Provision of both the recess 31x at the lower face of the outermost metal layer 31 and the recess 36x at the upper face of the outermost metal layer 36 allows the support post part 39a to be easily aligned relative to the outermost metal layers 31 and 36 during the process step illustrated in FIG. 4B.

The recess 31x may be formed by performing half-etching on the lower surface of the outermost metal layer 31, for example. The recess 36x may be formed by performing half-etching on the upper surface of the outermost metal layer 36, for example.

According to need, the lower face of the support post part 39a may be tentatively secured to the bottom face of the recess 36x with a solder, an adhesive which evaporates upon heating, or the like.

The thickness of the support post part 39a may be the same as the thickness of wall parts 37a and 38a before the solid-state bonding, for example.

Even when the thickness of the wall parts 37a and 38a and the thickness of the support post part 39a are set equal to each other before the solid-state bonding, pressure applied at the time of sold-state bonding serves to compress the meatal layers and the support posts, resulting in a thickness variation equal to the depths of the recesses 31x and 36x being absorbed. The thickness of the support post part 39a is not limited to this example, and may alternatively be thicker than the thickness of the wall parts 37a and 38a before the solid-state bonding, for example.

<Third Variation of First Embodiment>

The third variation of the first embodiment is directed to an example in which an intermediate metal layer is used as a mask for placing support posts. In connection with the third variation of the first embodiment, a description of the same or similar constituent elements as those of the previously provided descriptions may be omitted as appropriate.

Figure 9A:
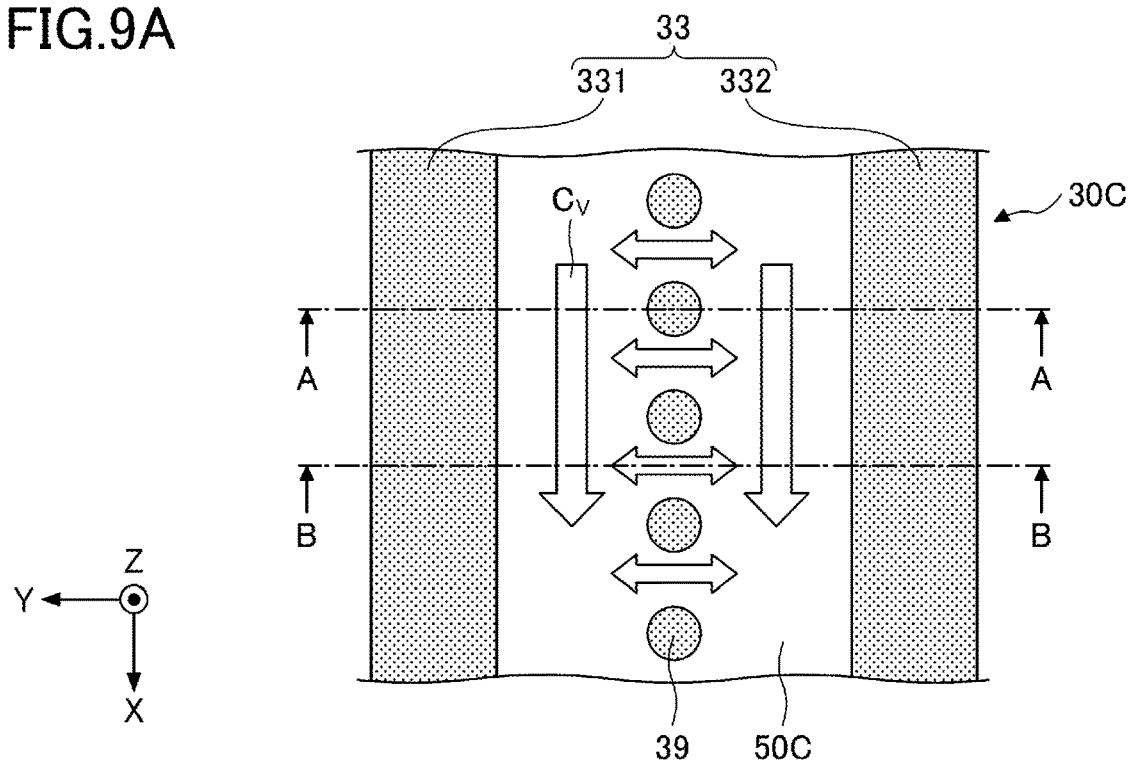
FIGS. 9A through 9C are drawings illustrating an example of the structure of a vapor line in a loop heat pipe according to a third variation of the first embodiment.
Figure 9B:
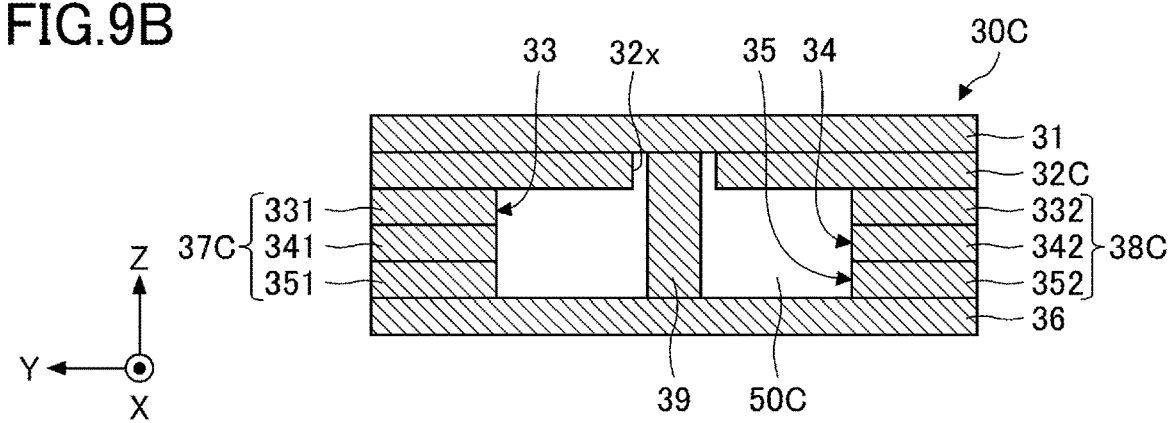
Figure 9C:
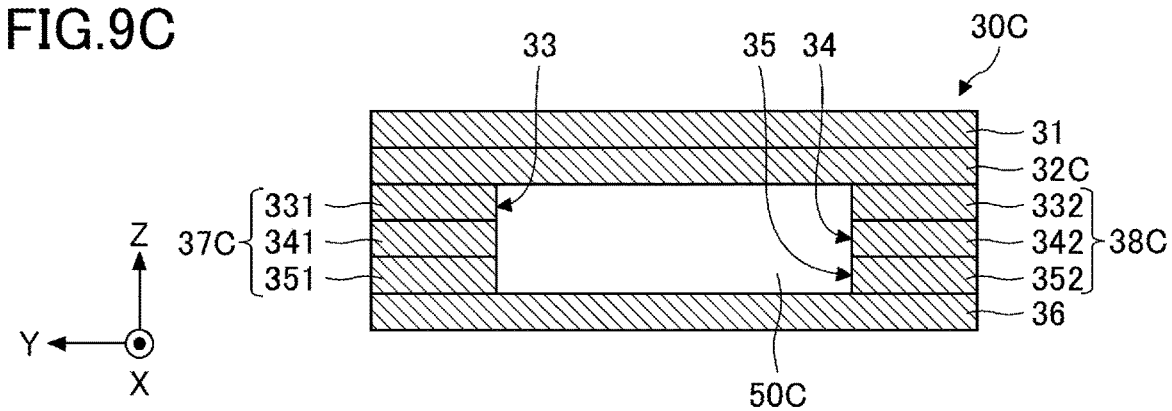

FIGS. 9A through 9C are drawings illustrating an example of the structure of a vapor line in a loop heat pipe according to the third variation of the first embodiment. FIG. 9A is a partial plan view corresponding to FIG. 3A. FIG. 9B is a cross-sectional view taken along a line A-A illustrated in FIG. 9A. FIG. 9C is a cross-sectional view taken along a line B-B illustrated in FIG. 9A. In FIG. 9A, the outermost metal layer 31 and an intermediate metal layer 32C are omitted from illustration. In FIG. 9A, the flow of the vapor Cv is schematically illustrated by arrows.

Referring to FIGS. 9A through 9C, a vapor line 30C differs from the vapor line 30 (see FIGS. 3A through 3C, for example) in that the intermediate metal layer 32 is replaced with the intermediate metal layer 32C.

The intermediate metal layer 32C has an opening 32x for placing the support post part 39a, at the position at which the support post part 39a is to be preferably placed. The upper end of the support post 39 is situated inside the opening 32x, with the upper end face of the support post 39 being bonded to the lower face of the outermost metal layer 31 exposed inside the opening 32x. In the case of the cylindrical support posts 39 being disposed at spaced intervals, for example, the intermediate metal layer 32C has circular openings 32x formed at spaced intervals having a diameter slightly greater than that of the support posts 39 (see FIG. 10A, which will be described later).

The stacked structure comprised of the wall portions 351, 341, and 331 constitutes one wall 37C (i.e., sidewall) of the vapor line 30. Further, the stacked structure comprised of the wall portions 352, 342, and 332 constitutes the other wall 38C (i.e., sidewall) of the vapor line 30. The outermost metal layer 36 is attached to one end of the stacked structure comprised of metal layers, and the outermost metal layer 31 is attached to the one end of the stacked structure, such that the walls 37C and 38C are placed therebetween. The walls 37C and 38C opposite to each other across a gap in the Y direction and the intermediate metal layer 32C and the outermost metal layer 36 opposite to each other across a gap in the Z direction defines a flow path 50C. The thickness (i.e., height) of the support post 39 exposed inside the flow path 50C (i.e., inside the space excluding the opening 32x) is the same as the thickness of the walls 37C and 38C.

Figure 10A:
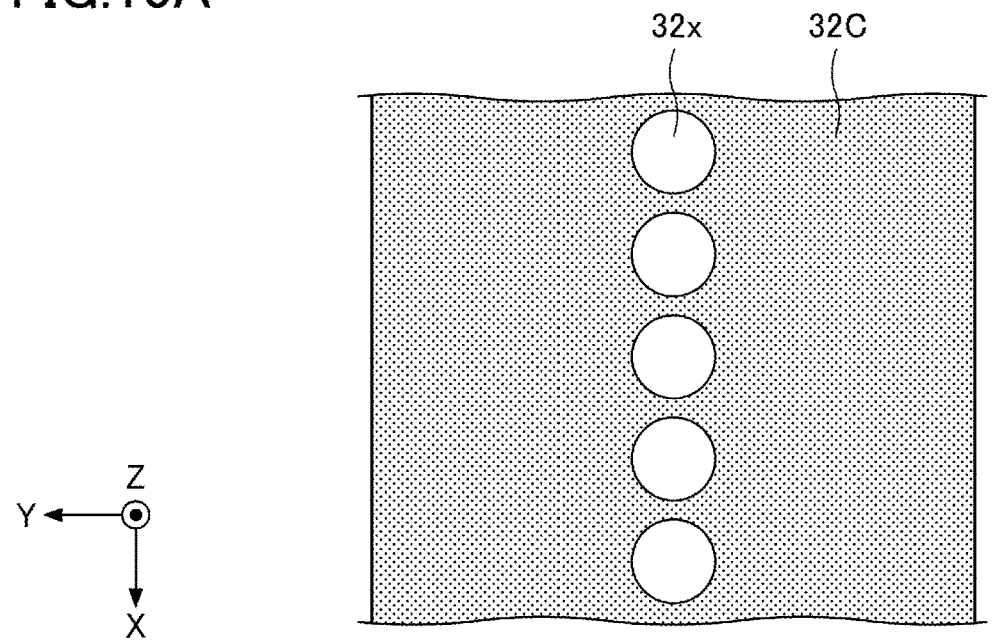
FIGS. 10A and 10B are drawings illustrating an example of process steps for making the loop heat pipe according to the third variation of the first embodiment.
Figure 10B:
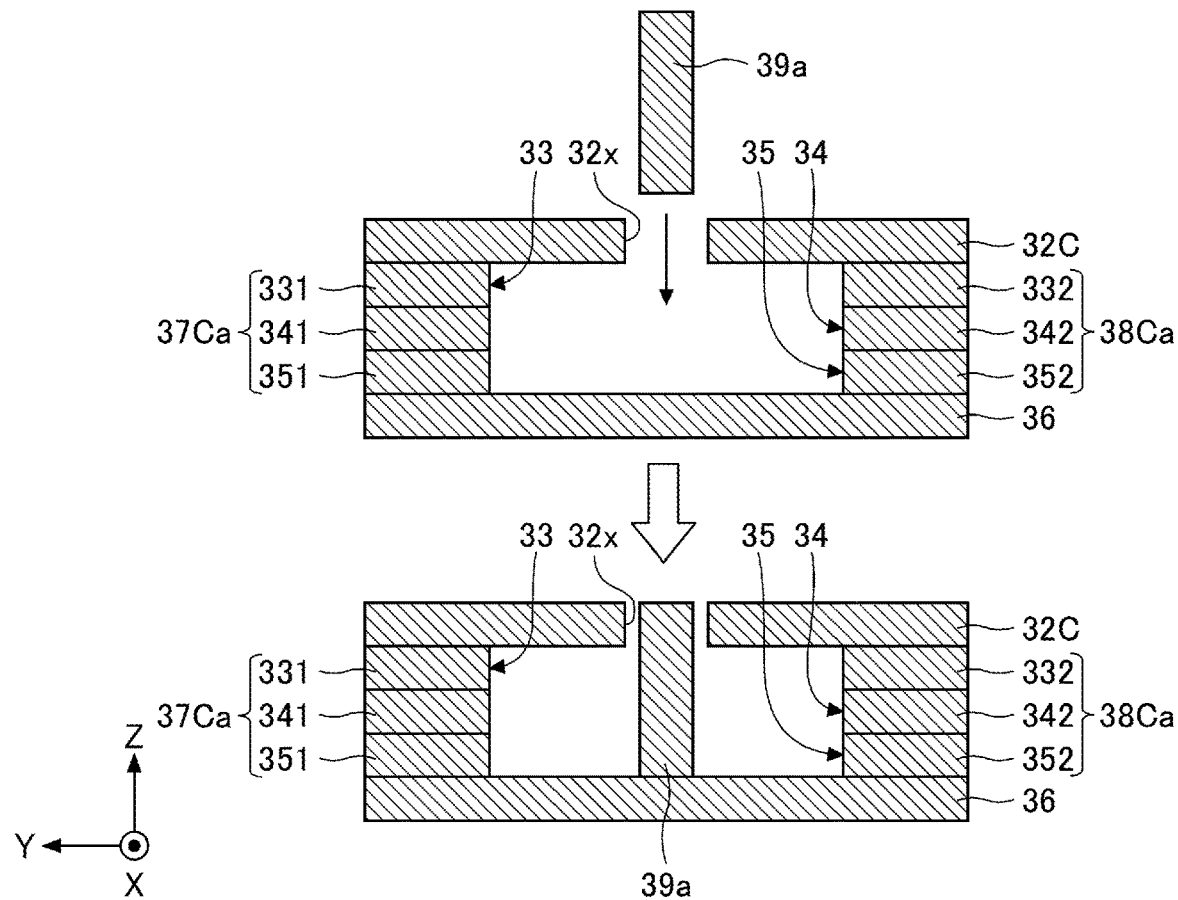

FIGS. 10A and 10B are drawings illustrating the steps of manufacturing a loop heat pipe according to the third variation of the first embodiment. FIG. 10A is a plan view, and FIG. 10B is a cross-sectional view corresponding to FIG. 9B.

In the process step illustrated in FIG. 10A, the intermediate metal layer 32C having openings 32x is made by performing an etching process or a stamping process with respect to a flat, solid metal layer.

In the process step illustrated in FIG. 10B, the intermediate metal layer 35, the intermediate metal layer 34, the intermediate metal layer 33, and the intermediate metal layer 32C are successively stacked on the outermost metal layer 36, followed by placing the support post parts 39a at predetermined positions on the support posts 39. Specifically, the support post parts 39a are inserted through the respective openings 32x as illustrated in the portion of FIG. 10B above the thick arrow, thereby being placed at predetermined positions on the outermost metal layer 36 as illustrated in the portion of FIG. 10B below the thick arrow. Process steps subsequent thereto are the same as those illustrated in FIG. 4C and FIG. 4D. Wall parts 37Ca and 38Ca will become the walls 37C and 38C, respectively, as illustrated in FIGS. 9B and 9C after solid-state bonding.

Provision of the openings 32x through the intermediate metal layer 32C allows the intermediate metal layer 32C to be used as a mask for placing the support post parts 39a, which enables an easy alignment of the support post parts 39a on the outermost metal layer 36 without using a dedicated mask.

It may be noted that, in the vapor line 30C, the recesses 36x may be formed at the upper face of the outermost metal layer 36 at the same respective positions as the openings 32x of the intermediate metal layer 32C in the plan view. This arrangement allows the support post parts 39a to be more easily aligned on the outermost metal layer 36.

Moreover, in the vapor line 30C, the recesses 36x may be formed at the lower face of the outermost metal layer 31 at the same respective positions as the openings 32x of the intermediate metal layer 32C in the plan view. Placing the support post parts 39a on the outermost metal layer 36 such that the upper ends thereof project into the openings 32x allows the support post parts 39a to be easily aligned with respect to the outermost metal layer 31.

<Fourth Variation of First Embodiment>

The fourth variation of the first embodiment is directed to an example of a variation of the support post arrangement. In connection with the fourth variation of the first embodiment, a description of the same or similar constituent elements as those of the previously provided descriptions may be omitted as appropriate.

Figure 11:
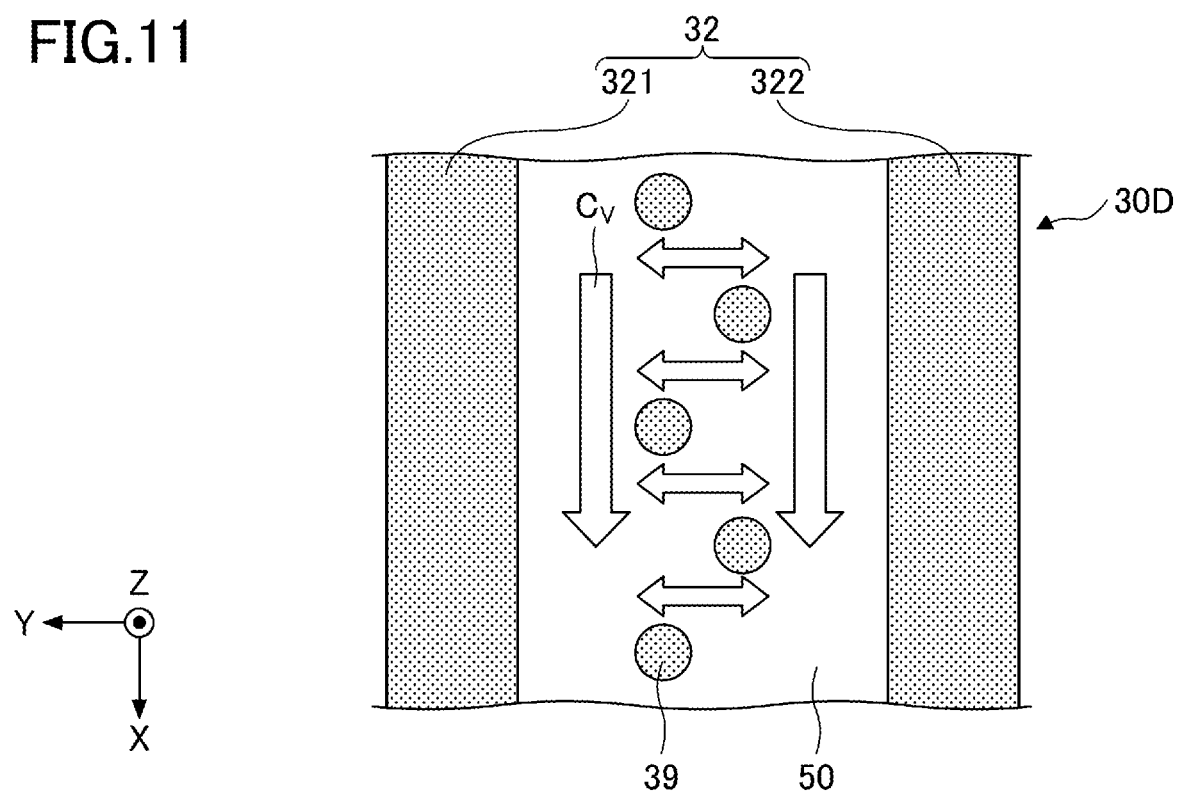
FIG. 11 is a partial plan view illustrating an example of the structure of a vapor line in a loop heat pipe according to a fourth variation of the first embodiment.

FIG. 11 is a partial plan view illustrating an example of the structure of a vapor line of a loop heat pipe according to the fourth variation of the first embodiment. FIG. 11 illustrates a portion corresponding to FIG. 3B. In FIG. 11, the outermost metal layer 31 is omitted from illustration. In FIG. 11, the flow of the vapor Cv is schematically illustrated by arrows.

Referring to FIG. 11, a vapor line 30D differs from the vapor line 30 (see FIGS. 3A through 3C, for example) in that the support posts 39 are placed in a zigzag formation. As in this example, the arrangement of the support posts 39 is not limited to a straight line formation, but may be a zigzag formation. Alternatively, the support posts 39 maybe arranged in another formation different from either a straight line formation or a zigzag formation.

<Fifth Variation of First Embodiment>

The fifth variation of the first embodiment is directed to another example of a variation of the support post arrangement. In connection with the fifth variation of the first embodiment, a description of the same or similar constituent elements as those of the previously provided descriptions may be omitted as appropriate.

Figure 12:
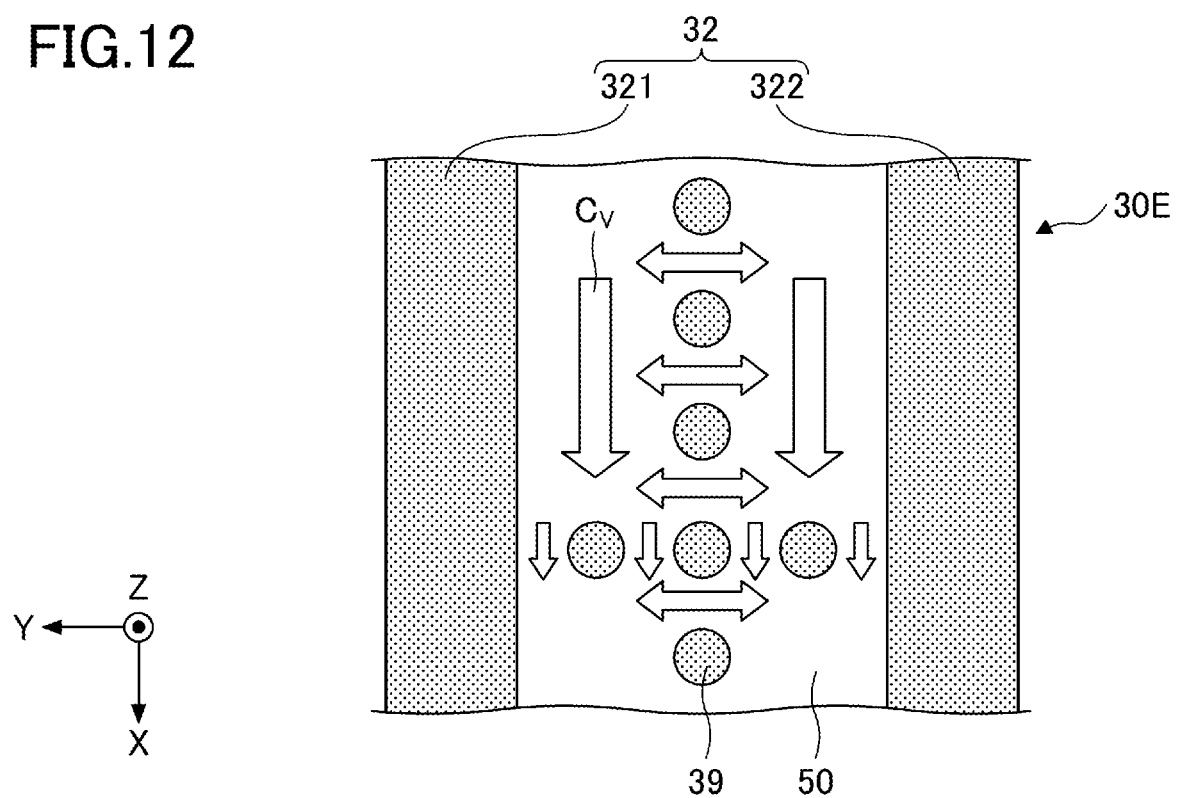
FIG. 12 is a partial plan view illustrating an example of the structure of a vapor line in a loop heat pipe according to a fifth variation of the first embodiment.

FIG. 12 is a partial plan view illustrating an example of the structure of a vapor line of a loop heat pipe according to the fifth variation of the first embodiment. FIG. 12 illustrates a portion corresponding to FIG. 3B. In FIG. 12, the outermost metal layer 31 is omitted from illustration. In FIG. 12, the flow of the vapor Cv is schematically illustrated by arrows.

Referring to FIG. 12, a vapor line 30E has the support posts 39, two or more of which are aligned in the Y direction. In other words, the support posts 39 include support posts aligned in one line in the longitudinal direction of the flow path 50 and support posts that are placed between the walls and those support posts aligned in one line. For example, the number of support posts 39 may be increased at the place where a force may be concentrated when pressure is applied during solid-state bonding for manufacturing the vapor line 30E.

Further, although the preferred embodiments have been described, the present invention is not limited to these embodiments, and various variations and modifications may be made without departing from the scope of the present invention.

For example, the evaporator, the condenser, and the liquid line in the above-noted embodiment and variations may also be provided with support posts similar to those of the vapor line. Placement of the support posts 39 at the places where a force is concentrated when pressure is applied during solid-state bonding efficiently reinforces the evaporator, the condenser, and the liquid line. Collapse of the flow path is also prevented.

The above-noted embodiment and variations have been directed to an example in which the support posts made of a single seamless member having the same thickness as the walls are provided in the vapor line of a loop heat pipe. Similarly, support posts made of a single seamless member having the same thickness as walls may be provided in a vapor line and a liquid line of a flat heat pipe.

According to at least one embodiment, a heat pipe for which the performance of heat transport is less likely to be degraded is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

The disclosures herein include the subject matter set out in the following clause:

A method of making a heat pipe comprising a process of making a vapor line having a flow path through which a working fluid vapor flows, wherein the process of making the vapor line includes:

stacking metal layers one over another to make walls situated opposite to each other across the flow path; and placing a support post made of a single seamless member in the flow path, such that the support post having the same thickness as the walls is disposed in the flow path and spaced apart from the walls.

What is claimed is:

1. A heat pipe comprising a vapor line having a flow path through which a working fluid vapor flows, wherein the vapor line includes:

walls opposite to each other across the flow path, the walls being made of a plurality of metal layers stacked one over another;

support posts disposed at spaced intervals and aligned in one line along a direction in which the working fluid vapor flows in the flow path, the support posts being spaced apart from the walls and each made of a single seamless member;

a first outermost metal layer stacked under the stacked metal layers;

an intermediate metal layer stacked over the stacked metal layers, the intermediate metal layer having a plurality of openings equal in number to the support posts; and a second outermost metal layer stacked over the intermediate metal layer, wherein the flow path is defined by the first outermost metal layer, the intermediate metal layer, the second outermost metal layer, and the walls situated opposite to each other, wherein a first end face of each of the support posts is bonded to the first outermost metal layer, and a second end face of each of the support posts is bonded to the second outermost metal layer, and wherein a tip of each of the support posts is inserted into a respective one of the openings of the intermediate metal layer.

2. The heat pipe as claimed in claim 1, wherein the second outermost metal layer has a surface facing toward the flow path and having a recess formed therein, the second end face of each of the support posts being bonded to a bottom face of the recess.

3. The heat pipe as claimed in claim 1, wherein the support posts are first support posts, and the heat pipe further includes second support posts, the first support posts and the second support posts being disposed in a zigzag formation in the flow path.

4. The heat pipe as claimed in claim 1, wherein the support posts are first support posts, and the heat pipe further includes second support posts, and wherein the second support posts are disposed between the walls and the first support posts.

5. The heat pipe as claimed in claim 1, further comprising:

an evaporator configured to evaporate a liquid working fluid;

a condenser configured to condense the working fluid vapor into the liquid working fluid; and a liquid line configured to connect the evaporator and the condenser, wherein the vapor line connects the evaporator and the condenser to form a loop with the liquid line.

* * * * *